(12) United States Patent
Cho et al.

(10) Patent No.: US 9,082,844 B2
(45) Date of Patent: Jul. 14, 2015

(54) METHODS OF TRANSFERRING SEMICONDUCTOR ELEMENTS AND MANUFACTURING SEMICONDUCTOR DEVICES

(71) Applicant: Samsung Electronics Co., Ltd., Suwon-Si, Gyeonggi-Do (KR)

(72) Inventors: Eun-hyoung Cho, Hwaseong-si (KR); Jun-Hee Choi, Seongnam-si (KR); Jin-seung Sohn, Seoul (KR); Chang-youl Moon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/077,956

(22) Filed: Nov. 12, 2013

(65) Prior Publication Data

US 2014/0242782 A1    Aug. 28, 2014

(30) Foreign Application Priority Data

Feb. 27, 2013    (KR) ........................ 10-2013-0021383

(51) Int. Cl.

| | | |
|---|---|---|
| H01L 21/00 | (2006.01) | |
| H01L 21/78 | (2006.01) | |
| H01L 33/00 | (2010.01) | |
| H01L 21/02 | (2006.01) | |
| H01L 21/28 | (2006.01) | |
| H01L 21/82 | (2006.01) | |

(Continued)

(52) U.S. Cl.
CPC ...... *H01L 21/7806* (2013.01); *H01L 21/02343* (2013.01); *H01L 21/28* (2013.01); *H01L 21/82* (2013.01); *H01L 33/0079* (2013.01); *H01L 33/02* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 2003/0003614 A1 | | 1/2003 | Andriessen |
| 2003/0064535 A1* | | 4/2003 | Kub et al. .................... 438/22 |
| 2005/0227455 A1* | | 10/2005 | Park et al. .................... 438/458 |

(Continued)

FOREIGN PATENT DOCUMENTS

| | | |
|---|---|---|
| KR | 20070115961 A | 12/2007 |
| KR | 20090047977 A | 5/2009 |
| KR | 20100026590 A | 3/2010 |
| KR | 20110042065 A | 4/2011 |

(Continued)

OTHER PUBLICATIONS

Choi, Jun Hee, "Nearly Single-Crystalline GaN Light-Emitting Diodes on Amorphous Glass Substrates", Nature Photonics, vol. 5, Dec. 2011, pp. 763-769.

(Continued)

*Primary Examiner* — Charles Garber
*Assistant Examiner* — Evren Seven
(74) *Attorney, Agent, or Firm* — Harness, Dickey & Pierce, P.L.C.

(57) ABSTRACT

The present disclosure relates to a method of transferring semiconductor elements from a non-flexible substrate to a flexible substrate. The present disclosure also relates to a method of manufacturing a flexible semiconductor device based on the method of transferring semiconductor elements. The semiconductor elements grown or formed on a non-flexible substrate may be effectively transferred to a resin layer while maintaining an arrangement of the semiconductor elements. The resin layer may function as a flexible substrate for supporting the vertical semiconductor elements.

18 Claims, 5 Drawing Sheets

(51) Int. Cl.
  *H01L 33/02* (2010.01)
  *H01L 33/32* (2010.01)

(56) References Cited

U.S. PATENT DOCUMENTS

| | | |
|---|---|---|
| 2006/0255341 A1* | 11/2006 | Pinnington et al. .............. 257/79 |
| 2008/0218068 A1 | 9/2008 | Cok |
| 2009/0068918 A1 | 3/2009 | Cok |
| 2011/0168976 A1 | 7/2011 | Mao |

FOREIGN PATENT DOCUMENTS

| | | |
|---|---|---|
| KR | 20120065273 A | 6/2012 |
| WO | WO-2010132552 A1 | 11/2010 |

OTHER PUBLICATIONS

Park, Sang-Il, "Printed Assemblies of Inorganic Light-Emitting Diodes for Deformable and Semitransparent Displays", Science, vol. 325, Aug. 21, 2009.

* cited by examiner

METHODS OF TRANSFERRING SEMICONDUCTOR ELEMENTS AND MANUFACTURING SEMICONDUCTOR DEVICES

CROSS-REFERENCE TO RELATED APPLICATION

This application claims priority under 35 U.S.C. §119 to Korean Patent Application No. 10-2013-0021383, filed on Feb. 27, 2013 in the Korean Intellectual Property Office, the disclosure of which is incorporated herein in its entirety by reference.

BACKGROUND

1. Field

The present disclosure relates to semiconductor devices and methods of manufacturing semiconductor devices. The present disclosure also relates to methods of transferring semiconductor elements.

2. Description of the Related Art

An optoelectronic device using an optoelectronic property of a semiconductor material is one example of various semiconductor devices that source, detect, and/or control light. The optoelectronic device includes a device that converts electrical energy into optical energy and a device that converts optical energy into electrical energy. Examples of a device that converts electrical energy into optical energy include a luminous device or a light-emitting device (e.g., a light-emitting diode (LED) and a laser diode (LD)). Examples of a device that converts optical energy into electrical energy include a photovoltaic device (e.g., a solar cell and a photodiode).

An optoelectronic device based on an inorganic semiconductor (e.g., a nitride semiconductor-based light-emitting device) has various advantages, including a relatively high efficiency, a relatively high luminance, and a relatively long lifespan. However, in order to manufacture a nitride semiconductor-based light-emitting device, a single crystal nitride layer needs to be epitaxially grown on a non-flexible substrate (e.g., a sapphire substrate or a silicon substrate).

However, a non-flexible substrate makes for a non-flexible semiconductor device, which is relatively difficult to morphologically transform and is disadvantageous in cost reduction and in manufacturing a semiconductor device having a relatively large surface area.

SUMMARY

The present disclosure relates to methods of transferring semiconductor elements formed on non-flexible substrates to flexible substrates.

The present disclosure also relates to methods of manufacturing flexible semiconductor devices based on the methods of transferring semiconductor elements.

Additional aspects will be set forth in part in the description which follows and, in part, will be apparent from the description, or may be learned by practice of the non-limiting embodiments.

According to example embodiments of the present disclosure, a method of transferring semiconductor elements may include forming vertical semiconductor elements on a substrate; forming an inorganic insulating layer on a surface of the vertical semiconductor elements; introducing —OH groups to a surface of the inorganic insulating layer; forming an amphipathic layer on the surface of the inorganic insulating layer; coating a polymerizable composition on the vertical semiconductor elements coated with the amphipathic layer; curing the polymerizable composition to form a first resin layer with the vertical semiconductor elements embedded therein; and separating the first resin layer along with the vertical semiconductor elements from the substrate.

According to example embodiments of the present disclosure, a method of manufacturing a flexible semiconductor device may include preparing a flexible laminate including a first resin layer, vertical semiconductor elements, and optionally, at least one of a mask layer, a buffer layer, and an underlayer disposed below the vertical semiconductor elements, the vertical semiconductor elements embedded in the first resin layer, the first resin layer exposing top portions and bottom portions of the vertical semiconductor elements; forming a top electrode on the top surface of the flexible laminate, the top electrode being electrically connected to the vertical semiconductor elements; and forming a bottom electrode on the opposing bottom surface of the flexible laminate, the bottom electrode being electrically connected to the vertical semiconductor elements.

Another method of manufacturing a flexible semiconductor device may include preparing a flexible laminate including a first resin layer, vertical semiconductor elements, a top electrode layer, a second resin layer, and optionally, at least one of a mask layer, a buffer layer, and an underlayer formed below the top electrode layer, the vertical semiconductor elements embedded in the first resin layer, the first resin layer exposing top portions and bottom portions of the vertical semiconductor elements; the top electrode layer formed on the vertical semiconductor elements, the second resin layer formed on the top electrode layer; and forming a bottom electrode on the bottom surface of the flexible laminate, the bottom electrode being electrically connected to the vertical semiconductor elements.

BRIEF DESCRIPTION OF THE DRAWINGS

The above and/or other aspects may become more apparent and better appreciated when the following description is taken in conjunction with the accompanying drawings in which.

DETAILED DESCRIPTION

Figure 1A:
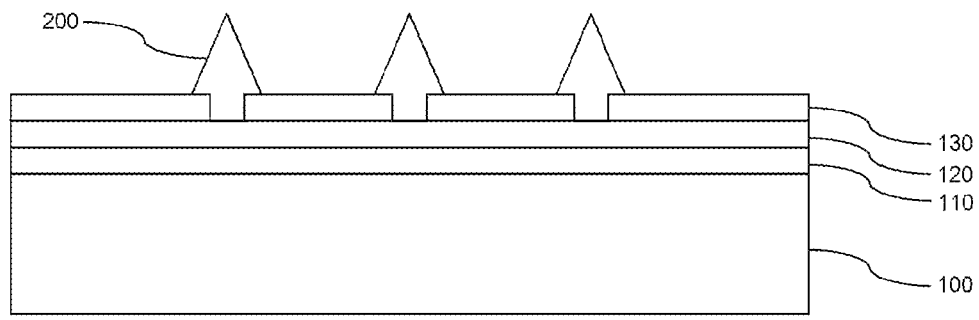
FIGS. 1A to 1F are cross-sectional views illustrating a method of transferring semiconductor elements according to example embodiments of the present disclosure.

Reference will now be made in more detail to various example embodiments, which may be illustrated in the accompanying drawings. In this regard, example embodiments herein may have different forms and should not be construed as being limited to the descriptions set forth herein. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a method of transferring semiconductor elements according to example embodiments of the present disclosure will be described in detail with reference to FIGS. 1A to 1F. FIGS. 1A to 1F are cross-sectional views illustrating a method of transferring semiconductor elements according to example embodiments of the present disclosure.

FIG. 1A illustrates vertical semiconductor elements 200 formed on a substrate 100. The substrate 100 may be a crystalline or a non-crystalline substrate. For example, the substrate 100 may be a crystalline substrate (e.g., sapphire substrate, silicon substrate). Otherwise, the substrate 100 may be a non-crystalline substrate (e.g., glass). Because a growth of the vertical semiconductor elements 200 is generally performed in a temperature range of about 560° C. to about 1040° C., it is desirable that the material used for the substrate 100 be one that remains stable in the above temperature range.

A surface of the substrate 100 may be coated by at least one selected from an underlayer 110, a buffer layer 120, and a mask layer 130. These layers may control and/or promote the growth of the vertical semiconductor elements 200. Alternatively, the vertical semiconductor elements 200 may be directly grown on the surface of the substrate 100.

The underlayer 110 may be, for example, a metal layer. More specifically, the underlayer 110 may include, for example, at least one of titanium (Ti), hafnium (Hf), zirconium (Zr), and aluminum (Al). The buffer layer 120 may be formed more easily on a substrate 100 coated with the underlayer 110 than on a substrate 100 not coated with the underlayer 110.

The buffer layer 120 may be, for example, a group III-V compound semiconductor. More specifically, the buffer layer 120 may be, for example, a GaN-based semiconductor, an AlN-based semiconductor, or a mixture thereof. More specifically, the buffer layer 120 may include, for example, at least one of GaN, AlN, InGaN, AlGaN, and AlInGaN. The buffer layer 120 may be a single layer structure. Alternatively, the buffer layer 120 may be, for example, a multi-layer structure (e.g., double layer structure, triple layer structure). The buffer layer 120 may be formed at a relatively low temperature between about 450° C. to about 650° C. For example, when the buffer layer 120 is formed with GaN at a relatively low temperature as in the range above, the buffer layer 120 may be referred to as a low-temperature (LT)-GaN layer. Also, when the buffer layer 120 is formed with AlN at a relatively low temperature as in the range above, the buffer layer 120 may be referred to as an LT-AlN layer. When the buffer layer 120 is formed on a surface of the underlayer 110, the buffer layer 120 may have an orientation in a vertical direction relative to the surface of the underlayer 110 due to an orientation of the underlayer 110. The buffer layer 120 may be patterned or unpatterned. An arrangement pattern of the vertical semiconductor elements 200 may be determined according to a pattern of the buffer layer 120. When the buffer layer 120 has been patterned, a mask layer 130 may not be needed.

The mask layer 130 may be, for example, silicon oxide, silicon nitride, or a mixture thereof. The mask layer 130 has at least one opening exposing the buffer layer 120. The opening may have a shape of, for example, a hole. A diameter of the opening may be, for example, about several nm to about several μm. The mask layer 130 may have a single layer or a multi-layer structure. A thickness of the mask layer 130 may be, for example, about 10 nm to about 500 nm, and more specifically, about 10 nm to about 200 nm. The thickness of the mask layer 130 is related to a bonding strength between the substrate 100 and the vertical semiconductor elements 200 that are grown thereon. When the thickness of the mask layer 130 is too thin, the bonding strength may decrease by more than a desired amount. On the other hand, when the thickness of the mask layer 130 is too thick, the bonding strength may increase by more than a desired amount. Accordingly, in order for the vertical semiconductor elements 200 to be more easily transferred to another substrate, the mask layer 130 may be selected to have a suitable thickness to facilitate a relatively easy transfer. An arrangement pattern of the vertical semiconductor elements 200 may be determined according to an arrangement of the openings of the mask layer 130.

The vertical semiconductor elements 200 may be, for example, grown on regions of the buffer layer 120 which are exposed through the openings of the mask layer 130. The term "vertical semiconductor elements" as used herein refers to semiconductor elements having a longest dimension in a vertical direction relative to a surface of a substrate. A shape of a longitudinal section or a cross-section may be any shape. For example, the vertical semiconductor elements 200 may have, for example, a pyramid shape, a rod shape, a semi-elliptical shape, or a similar shape thereof. The vertical semiconductor elements 200 may be a single layer structure in a vertical direction or a multi-layered structure in a vertical direction. The vertical semiconductor elements 200 may have, for example, a group III-V compound semiconductor. In greater detail, the vertical semiconductor elements 200 may be, for example, a GaN-based semiconductor. The GaN-based semiconductor may include, for example, at least one of GaN, InGaN, AlGaN, and AlInGaN. At least some of the vertical semiconductor elements 200 may be, for example, formed at a relatively high temperature in a range of about 900° C. to about 1100° C. For example, when some of the vertical semiconductor elements 200 are formed with GaN at such a high temperature, the GaN may be referred to as a high temperature (HT)-GaN. At least some of the vertical semiconductor elements 200 may include the HT-GaN or a material based on the HT-GaN. The vertical semiconductor elements 200 may also have an orientation in the vertical direction because the vertical semiconductor elements 200 are grown from the surface of the buffer layer 120. The vertical semiconductor elements 200 may have a relatively high or desired level of crystallinity.

Forming the underlayer 110, the buffer layer 120, the mask layer 130, and/or the vertical semiconductor elements 200 on the substrate 100 may be performed by, for example, atomic layer deposition, chemical vapor deposition, sputtering, etc.

Figure 1B:
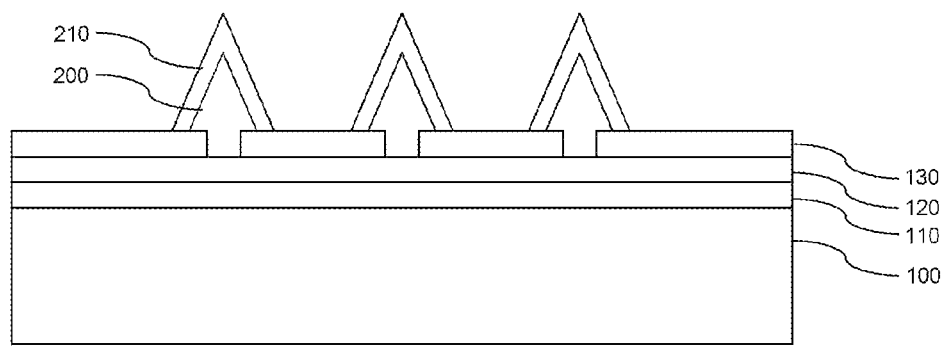

FIG. 1B illustrates inorganic insulating layers 210 formed on surfaces of the vertical semiconductor elements 200. The inorganic insulating layers 210 may be, for example, $SiO_2$, $Si_3N_4$, or a combination thereof. Forming the inorganic insulating layers 210 may be performed by, for example, atomic layer deposition, chemical vapor deposition, sputtering, etc. After forming the inorganic insulating layers 210, a sufficient amount of —OH groups may be introduced to surfaces of the inorganic insulating layers 210 by treating the inorganic insulating layers 210 with plasma or a strong acid. A plasma treatment may be performed by using, for example, a typical $O_2$ plasma process. A strong acid treatment may be performed by using, for example, a method including soaking a substrate in a solution where sulfuric acid and hydrogen peroxide are mixed in a ratio of 7:3 at a temperature of 70° C. for 30 minutes, washing the substrate with deionized water, and drying the substrate in an oven at a temperature of 100° C. Those of ordinary skill in the art will appreciate that a strong acid is an acid that dissociates completely (rather than partially) in an aqueous solution. Additionally, those of ordinary skill in the art will understand a strong acid to be an acid with a $pK_a < -1.74$.

Figure 1C:
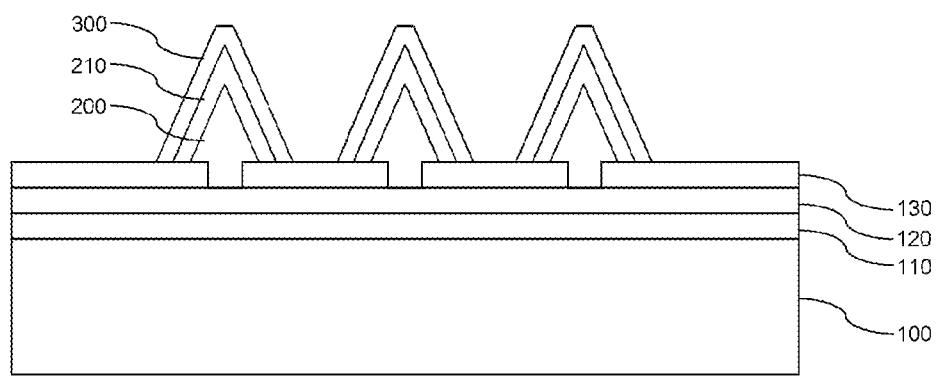

FIG. 1C illustrates an amphipathic layers 300 formed on surfaces of the inorganic insulating layers 210 which are formed on the surfaces of the vertical semiconductor elements 200. The amphipathic layers 300 are formed of or include an amphipathic material. The amphipathic material refers to a material having both a hydrolyzable group and an organofunctional group. The hydrolyzable group may be, for example, a methoxysilyl group, an alkoxy group, an acyloxy group, a halogen atom, an amine group, or a combination thereof. The organofunctional group may be, for example, an epoxide group. The amphipathic material having the hydrolyzable group and the organofunctional group may be, for example, a silane coupling agent. The silane coupling agent may be, for example, a 3-glycidoxypropyltrimethoxysilane (3-GPTS). 3-GPTS has a methoxysilyl group as the hydrolyzable group, and an epoxide group as the organofunctional group. The amphipathic layer 300 may be formed by, for example, coating a solution including the amphipathic material on the surfaces of the vertical semiconductor elements 200 and removing the solvent. When 3-GPTS is used as the amphipathic material, isopropyl alcohol may be used as the solvent, and the content of 3-GPTS may be about 5 wt %. Coating the solution including the amphipathic material may be performed by, for example, spin coating or spray coating. The hydrolyzable groups of the amphipathic layers 300 may bond to an —OH group on surfaces of the inorganic insulating layers 210 through a hydrolytic condensation reaction. Accordingly, the amphipathic layers 300 and the inorganic insulating layers 210 may strongly bond to each other.

Figure 1D:
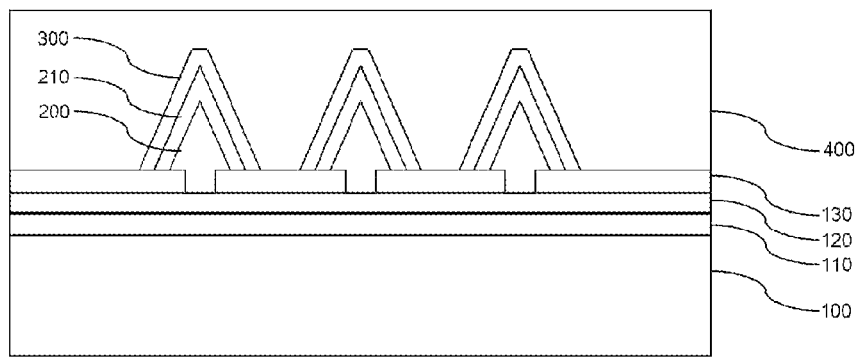

FIG. 1D illustrates a polymerizable composition layer 400 coated on the vertical semiconductor elements 200 which are coated with the inorganic insulating layers 210 and the amphipathic layers 300. The polymerizable composition may be, for example, a composition including a polymerizable monomer; a reactive diluent; and an initiator. Here, the polymerizable monomer includes a polymerizable monomer, a polymerizable oligomer, a polymerizable macromonomer, and the like. The polymerizable monomer may be, for example, urethane acrylate, epoxy acrylate, or a combination thereof. The reactive diluents may be, for example, 2-hydroxypropyl-acrylate (2-HPA), trimethylolpropane triacrylate, polyester-based acrylic monomer, or a combination thereof. The initiator may be, for example, a thermoinitiator, a photoinitiator, or a combination thereof. The photoinitiator may be 1-hydroxycyclohexyl phenyl ketone, oxo-phenyl-acetic acid 1-methyl-2-[2-(2-oxo-2-phenyl-acetoxy)-propoxy]-ethyl ester, or a combination thereof. The content of polymerizable monomers of the polymerizable composition may be, for example, about 50 wt % to about 80 wt %. The content of the reactive diluents may be, for example, about 20 wt % to about 40 wt %. The content of the photoinitiator of the polymerizable composition may be for example, about 3 wt % to about 5 wt %. The polymerizable composition may be commercially available. Examples of a commercially available polymerizable composition are TSV (a UV curable polymerizable composition including urethane acrylate, 2-HPA, and 1-hydroxycyclohexyl phenyl ketone, available from MinutaTech, Korea), or the like. Coating the polymerizable composition may be performed by, for example, spin coating spray coating, or the like.

Figure 1E:
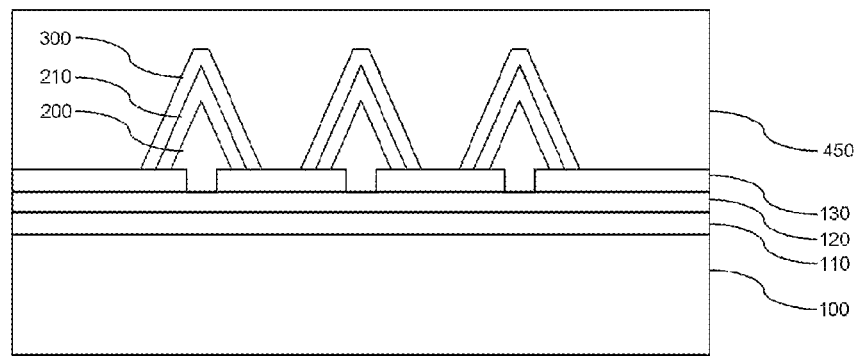

FIG. 1E illustrates the vertical semiconductor elements 200 embedded in a first resin layer 450. The first resin layer 450 is obtained by curing the polymerizable composition layer 400. Curing the polymerizable composition layer 400 may be performed by, for example, applying heat or light to the polymerizable composition layer 400. When the polymerizable composition layer 400 includes a thermoinitiator, the polymerizable composition layer 400 may be cured by applying heat to the polymerizable composition layer 400. When the polymerizable composition layer 400 includes a photoinitiator, the polymerizable composition layer 400 may be cured by applying light (for example, UV rays, and more specifically, UV rays having a wavelength of about 365 nm) to the polymerizable composition layer 400. A temperature of heat curing or a wavelength of light curing may vary according to the thermoinitiator used or the photoinitiator used. During the curing process, a polymerization reaction of the polymerizable monomers of the polymerizable composition occurs and a bonding between the polymerizable monomer of the polymerizable composition and the organofunctional group of the amphipathic layer 300 occurs. Accordingly, the cured first resin layer 450 and the vertical semiconductor elements 200 strongly bond to each other by having the inorganic insulating layer 210 and the amphipathic layer 300 as media. A bonding strength between the cured first resin layer 450 and the vertical semiconductor elements 200 is stronger than a bonding strength between the substrate 100 and the vertical semiconductor elements 200. The bonding strength between the cured first resin layer 450 and the vertical semiconductor elements 200 is also stronger than a bonding strength between the substrate 100 and the underlayer 110. The bonding strength between the cured first resin layer 450 and the vertical semiconductor elements 200 is also stronger than a bonding strength between the substrate 100 and the buffer layer 120.

Figure 1F:
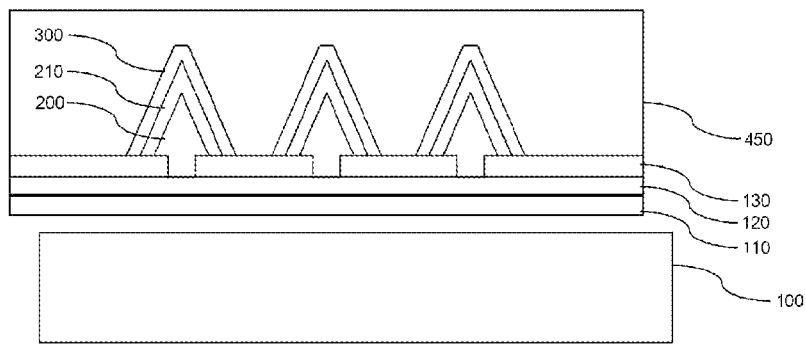

FIG. 1F illustrates separating the first resin layer 450 along with the vertical semiconductor elements 200 from the substrate 100. When the first resin layer 450 is stripped off from the substrate 100, the vertical semiconductor elements 200 are separated from the substrate 100, as embedded in the first resin layer 450 because of a strong bonding strength between the cured first resin layer 450 and the vertical semiconductor elements 200. When the underlayer 110, the buffer layer 120, and/or the mask layer 130 are formed between the vertical semiconductor elements 200 and the substrate 100, the underlayer 110, the buffer layer 120, and/or the mask layer 130 may be separated from the substrate 100, as coupled to the vertical semiconductor elements 200.

The vertical semiconductor elements 200 grown or formed on the substrate may be very effectively transferred to the first resin layer 450 through a series of processes illustrated in FIGS. 1A-1F while maintaining their arrangement. Furthermore, the first resin layer 450 functions as a flexible substrate supporting the vertical semiconductor elements 200.

Figure 2:
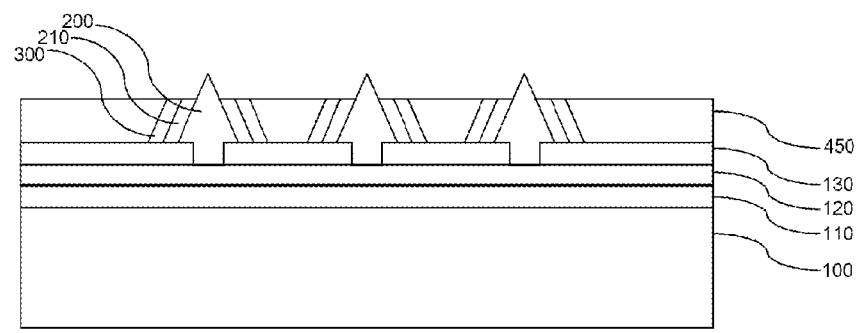
FIG. 2 illustrates vertical semiconductor elements whose top portions are exposed due to an etching of a first resin layer according to example embodiments of the present disclosure.

Another method of transferring semiconductor elements according to example embodiments of the present disclosure may further include exposing top portions of the vertical semiconductor elements 200 by etching the top of the first resin layer 450. FIG. 2 illustrates the vertical semiconductor elements 200 whose top portions are exposed due to an etching of the first resin layer 450. The etching of the first resin layer 450 may be performed by using, for example, an etching gas including $CF_4$ and $O_2$. Through the etching of the first resin layer 450, the top portions of the vertical semiconductor elements 200 may be exposed to the exterior. For example, the top portions exposed to the exterior of the first resin layer 450 may have a length of about ⅕ to about ½ of the entire vertical length of each vertical semiconductor element 200. In another non-limiting embodiment, exposing the top portions of the vertical semiconductor elements 200 by etching the first resin layer 450 may be performed before separating the first resin layer 450 along with the vertical semiconductor elements 200 from the substrate 100. Also, in another non-limiting embodiment, exposing the top portions of the vertical semiconductor elements 200 by etching the first resin layer 450 may be performed after separating the vertical semiconductor elements along with the resin layer 450 from the substrate 100.

Figure 3:
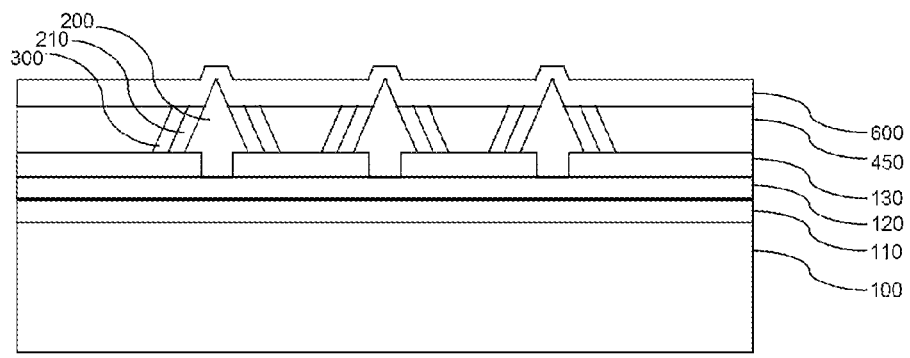
FIG. 3 illustrates a top electrode layer formed on vertical semiconductor elements whose top portions are exposed according to example embodiments of the present disclosure.

Another method of transferring semiconductor elements according to example embodiments of the present disclosure may further include forming a top electrode layer on the vertical semiconductor elements whose top portions are exposed. FIG. 3 illustrates the top electrode layer 600 formed on the vertical semiconductor elements 200 whose top portions are exposed. The top electrode layer 600 may be a transparent or a non-transparent electrode. The transparent electrode may be formed of, for example, graphene, or transparent conductive oxides (TCO) (e.g., indium tin oxide (ITO)). The non-transparent electrode may be formed of, for example, gold (Au), palladium (Pd), aluminum (Al), platinum (Pt), silver (Ag), titanium (Ti), or a mixture thereof.

Figure 4:
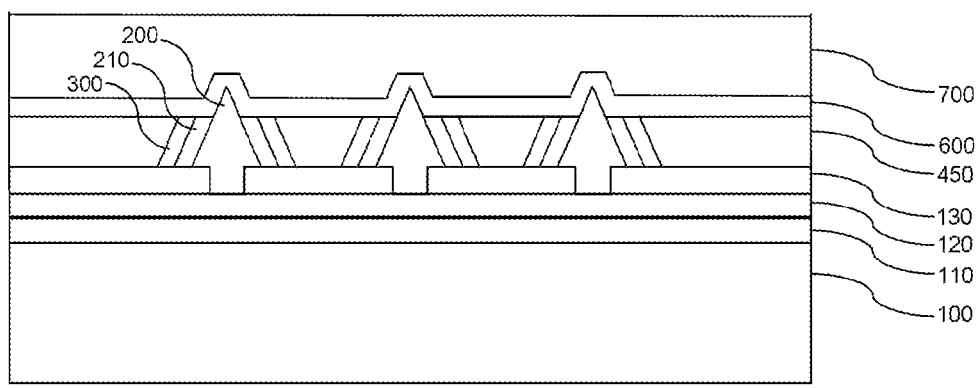
FIG. 4 illustrates a second resin layer formed on the top electrode layer according to example embodiments of the present disclosure.

Another method of transferring semiconductor elements according to example embodiments of the present disclosure may further include forming a second resin layer on the top electrode layer. FIG. 4 illustrates a second resin layer 700 formed on a top electrode layer 600. The second resin layer 700 may be formed by, for example, coating a polymerizable composition on the top electrode layer 600 and curing the same. The polymerizable composition may be the same as described above in connection with the formation of the first resin layer 450. However, it should be understood that the second resin layer 700 may be the same as or different from the first resin layer 450. According to another example embodiment, an inorganic insulating layer and/or amphipathic layer may be formed on the top electrode layer before coating the polymerizable composition on the top electrode layer. Also, —OH groups may be introduced to a surface of the inorganic insulating layer. The inorganic insulating layer and the amphipathic layer may be the same as described above in connection with the formation of the inorganic insulating layer 210 and the amphipathic layer 300.

Figure 5:
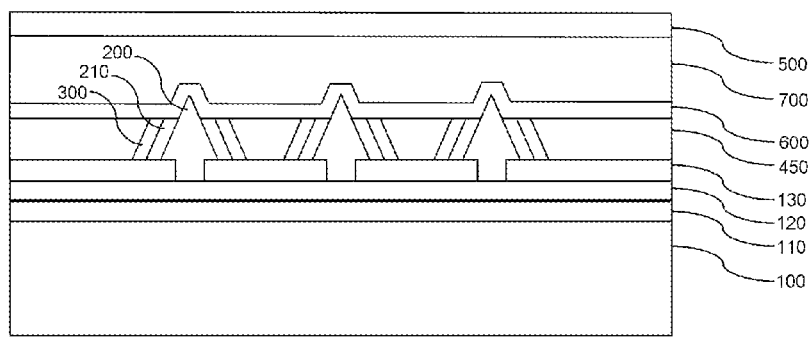
FIG. 5 illustrates a support layer formed on the second resin layer according to example embodiments of the present disclosure.

Another method of transferring semiconductor elements according to example embodiments of the present disclosure may further include forming a support layer on the second resin layer. FIG. 5 illustrates a support layer 500 formed on the second resin layer 700. For example, the support layer 500 may be adhered to the cured second resin layer 700. According to another example embodiment, the support layer 500 may be formed by coating a polymerizable composition on the top electrode layer 600; compressing the support layer 500 on the coated polymerizable composition; and curing the coated polymerizable composition. The support layer 500 may be, for example, a polyethyleneterephthalate film; a polycarbonate film, or the like.

According to another example embodiment, one surface of the support layer 500 contacting the polymerizable composition for the second resin layer 700 may be coated with an adhesion promoter. The adhesion promoter may increase a bonding strength between the second resin layer 700 and the support layer 500. The adhesion promoter may be suitably selected depending upon the materials for the support layer 500 and the second resin layer 700. According to another example embodiment, one surface of the support layer 500 contacting the polymerizable composition for the second resin layer 700 may be coated with an adhesion preventer. The adhesion preventer prevents excessive adhesion between the second resin layer 700 and the support layer 500 so as to facilitate a separation of the second resin layer 700 and the support layer 500 during a later step. The adhesion preventer may be suitably selected depending upon the materials for the support layer 500 and the second resin layer 700. The adhesion preventer may be for example, urethane acrylate resin or the like.

A bonding strength between the second resin layer 700 and the support layer 500 is stronger than a bonding strength between the substrate 100 and the vertical semiconductor elements 200. The bonding strength between the second resin layer 700 and the support layer 500 is also stronger than a bonding strength between the substrate 100 and an underlayer 110. The bonding strength between the second resin layer 700 and the support layer 500 is also stronger than a bonding strength between the substrate 100 and a buffer layer 120.

A bonding strength between the support layer 500 the second resin layer 700, a bonding strength between the second resin layer 700 and the first resin layer 450, a bonding strength between the first resin layer 450 and the vertical semiconductor elements 200, and the like are stronger than a bonding strength between the vertical semiconductor elements 200 and the substrate 100. Thus, when the support layer 500 is stripped off from the substrate, the vertical semiconductor elements 200, the first resin layer 450, and the second resin layer 700 are also separated from the substrate 100 while being supported by the support layer 500. When the underlayer 110, the buffer layer 120 and/or the mask layer 130 are formed between the vertical semiconductor elements 200 and the substrate 100, the under layer 110, the buffer layer 120, and/or the mask layer 130 may also be separated from the substrate 100 while remaining bonded to the vertical semiconductor elements 200. Since the mechanical strength of the second resin layer 700 and the first resin layer 450 is reinforced by the support from the support layer 500, the second resin layer 700 and the first resin layer 450 may be prevented from being damaged when the layers are being separated from the substrate 100. Accordingly, using the support layer 500 may be beneficial when manufacturing a relatively large area semiconductor device.

Figure 6:
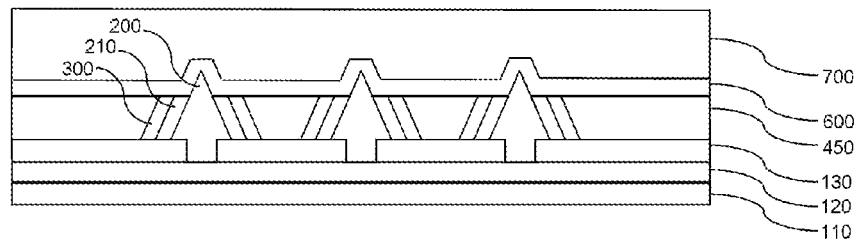
FIG. 6 illustrates the second resin layer and the first resin layer after removing a substrate and the support layer according to example embodiments of the present disclosure.

Another method of transferring semiconductor elements according to example embodiments of the present disclosure may further include removing a support layer after separating a first resin layer along with vertical semiconductor elements from a substrate. FIG. 6 illustrates the second resin layer 700 and the first resin layer 450 after removing the substrate 100 and the support layer 500.

Figure 7:
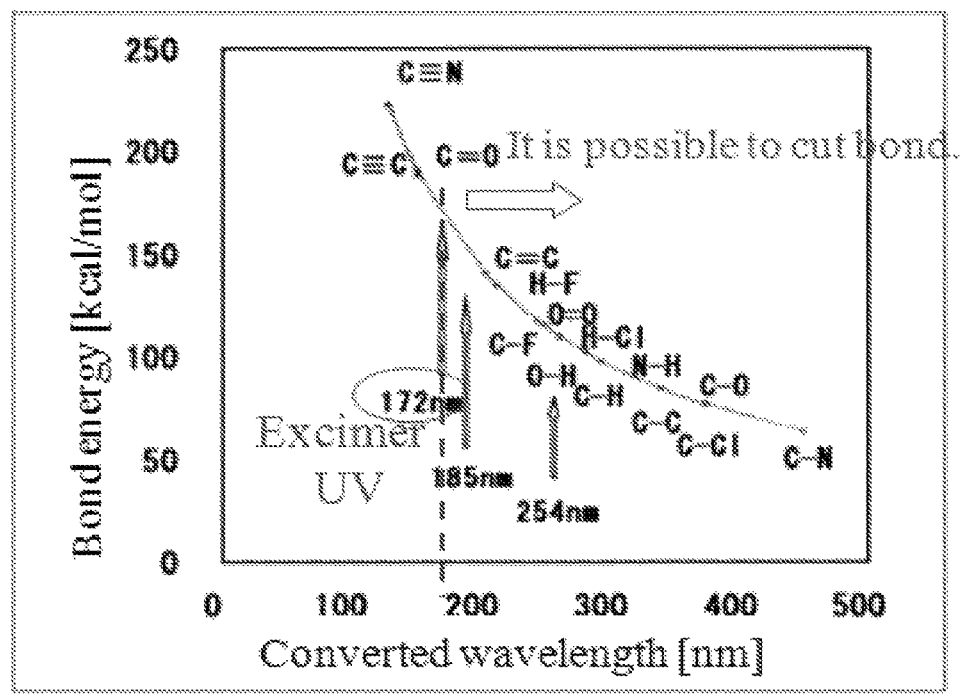
FIG. 7 is a graph illustrating a relationship between various types of bonds and corresponding wavelengths for breaking the bonds according to example embodiments of the present disclosure.

Removing the support layer 500 may be performed by, for example, etching. Etching the support layer 500 may be performed by, for example, using an etching gas including $CF_4$ and $O_2$. Removing the support layer 500 may be performed by, for example, breaking or destroying a bond between the support layer 500 and the second resin layer 700 through a photolysis process. In greater detail, for example, a laminate, including the support layer 500, the second resin layer 700, the first resin layer 450 and the vertical semiconductor elements 200 separated from the substrate 100, may be placed on a dummy substrate, then, a bond between the support layer 500 and the second resin layer 700 may be broken or destroyed by applying a wavelength for breaking or destroying a molecular bond to the support layer 500. As a result, the adhesion between the support layer 500 and the second resin layer 700 becomes weaker than the adhesion between the dummy substrate and the vertical semiconductor elements 200. Accordingly, the support layer 500 may be removed with relative ease by stripping off the support layer 500. The wavelength for breaking or destroying a molecular bond may be a wavelength corresponding to the bonding energy of various types of bonds. The various types of bonds and the wavelengths for breaking or destroying a molecular bond corresponding to the bonds are illustrated in FIG. 7. For example, by using a wavelength of about 172 nm, the most chemical bonds having the bonding energy not more than that of a $C=C$ bond may be broken or destroyed.

A method of manufacturing a flexible semiconductor device according to example embodiments of the present disclosure may include preparing a flexible laminate including a first resin layer; vertical semiconductor elements embedded in the first resin layer, wherein top portions of the vertical semiconductor elements are exposed above the first resin layer and bottom portions of the vertical semiconductor elements are exposed below the first resin layer; and optionally, at least one of a mask layer, a buffer layer and an underlayer is disposed below the vertical semiconductor elements. The method may additionally include forming a top electrode on the top surface of the flexible laminate, the top electrode being electrically connected to the vertical semiconductor elements. The method may also include forming a bottom electrode on the opposing bottom surface of the flexible laminate, the bottom electrode being electrically connected to the vertical semiconductor elements.

The flexible laminate including the first resin layer, the vertical semiconductor elements, the optional mask layer, the optional buffer layer, and the optional underlayer may be prepared according to the non-limiting embodiments of the method of transferring the semiconductor elements described above.

At least one of the top electrode and the bottom electrode may be a transparent electrode. For example, both of the top electrode and the bottom electrode may be transparent electrodes. The transparent electrode may be formed of, for example, graphene, or transparent conductive oxide (TCO) (e.g., indium tin oxide (ITO)). In another example, one of the top electrode and the bottom electrode may be a transparent electrode, and the other electrode may be a non-transparent electrode. The non-transparent electrode may be formed of, for example, gold (Au), palladium (Pd), aluminum (Al), platinum (Pt), silver (Ag), titanium (Ti), or a combination thereof. However, the materials for the top electrode and the bottom electrode described here in detail are for illustrative purposes only, and various other materials may be used as the materials for the top electrode and the bottom electrode.

Another method of manufacturing a flexible semiconductor device according to example embodiments of the present disclosure may include preparing a flexible laminate including a first resin layer; vertical semiconductor elements embedded in the first resin layer, wherein top portions of the vertical semiconductor elements are exposed above the first resin layer and bottom portions of the vertical semiconductor elements are exposed below the first resin layer; a top electrode formed on the vertical semiconductor elements; a second resin layer formed on the top electrode; and optionally, at least one of a mask layer, a buffer layer, and an underlayer disposed below the vertical semiconductor elements. The method may additionally include forming a bottom electrode on the bottom surface of the flexible laminate, the bottom electrode being electrically connected to the vertical semiconductor elements.

The flexible laminate including the first resin layer; the vertical semiconductor elements, the top electrode layer, the second resin layer, the optional mask layer, the optional buffer layer, and the optional underlayer may be prepared according to the non-limiting embodiments of the method of transferring the semiconductor elements described above.

At least one of the top electrode and the bottom electrode may be a transparent electrode. For example, both of the top electrode and the bottom electrode may be transparent electrodes. The transparent electrode may be formed of, for example, graphene, or transparent conductive oxide (TCO) (e.g., indium tin oxide (ITO)). In another example, one of the top electrode and the bottom electrode may be a transparent electrode, and the other electrode may be a non-transparent electrode. The non-transparent electrode may be formed of, for example, gold (Au), palladium (Pd), aluminum (Al), platinum (Pt), silver (Ag), titanium (Ti), or a combination thereof. However, the materials for the top electrode and the bottom electrode described here in detail are for illustrative purposes only, and various other materials may be used as the materials for the top electrode and the bottom electrode.

The present disclosure provides a method of transferring semiconductor elements formed on a non-flexible substrate to a flexible substrate. The present disclosure also provides a method of manufacturing a semiconductor device based on the method of transferring the semiconductor elements.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims. That being said, the descriptions of features or aspects within each embodiment should typically be considered as available for other similar features or aspects in other embodiments.

What is claimed is:

1. A method of transferring semiconductor elements, comprising:
   forming vertical semiconductor elements on a substrate;
   forming an inorganic insulating layer on the vertical semiconductor elements;
   introducing —OH groups to the inorganic insulating layer;
   forming an amphipathic layer on the inorganic insulating layer;
   coating a polymerizable composition on the amphipathic layer;
   curing the polymerizable composition to form a first resin layer with the vertical semiconductor elements embedded therein; and
   separating the first resin layer along with the vertical semiconductor elements from the substrate.

2. The method of claim 1, wherein the forming vertical semiconductor elements includes coating the substrate with at least one of an underlayer, a buffer layer, and a mask layer.

3. The method of claim 2, wherein the coating the substrate includes patterning the buffer layer.

4. The method of claim 2, wherein the coating the substrate includes forming the mask layer to a thickness of about 10 nm to about 500 nm.

5. The method of claim 1, wherein the forming vertical semiconductor elements includes fabricating the vertical semiconductor elements of GaN-based semiconductors.

6. The method of claim 1, wherein the forming an inorganic insulating layer includes fabricating the inorganic insulating layer of $SiO_2$.

7. The method of claim 1, wherein the introducing —OH groups includes the treating the inorganic insulating layer with plasma or a strong acid.

8. The method of claim 1, wherein the forming an amphipathic layer includes the amphipathic layer having a methoxysilyl group, an alkoxy group, an acyloxy group, a halogen atom, an amine group, or a combination thereof as a hydrolyzable group.

9. The method of claim 1, wherein the forming an amphipathic layer includes the amphipathic layer having an epoxide group as an organofunctional group.

10. The method of claim 1, wherein the coating a polymerizable composition includes the polymerizable composition including a polymerizable monomer, a reactive diluent, and an initiator.

11. The method of claim 1, further comprising:
    exposing top portions of the vertical semiconductor elements by etching the first resin layer before the separating the first resin layer.

12. The method of claim 11 further comprising:
    forming a top electrode layer on the vertical semiconductor elements after the exposing top portions of the vertical semiconductor elements.

13. The method of claim 12 further comprising:
    forming a second resin layer on the top electrode layer.

14. The method of claim 13 further comprising:
    forming a support layer on the second resin layer.

15. The method of claim 14, wherein the forming a support layer includes coating a surface of the support layer contacting the second resin layer with an adhesion promoter.

16. The method of claim 14, wherein the forming a support layer includes coating a surface of the support layer contacting the second resin layer with an adhesion preventer.

17. The method of claim 14 further comprising:
    removing the support layer after the separating the first resin layer.

18. The method of claim 17, wherein the removing the support layer includes breaking a bond between the support layer and the second resin layer through a photolysis process.

* * * * *